United States Patent [19]

Watanabe et al.

[11] 4,225,828
[45] Sep. 30, 1980

[54] PLL SYNTHESIZER

[75] Inventors: Masahiro Watanabe, Sagamihara; Hiroshi Haruki, Yokohama, both of Japan

[73] Assignee: Matsushita Electric Industrial Co., Ltd., Osaka, Japan

[21] Appl. No.: 895,073

[22] Filed: Apr. 10, 1978

[30] Foreign Application Priority Data

Apr. 20, 1977 [JP] Japan .................................. 52-46263

[51] Int. Cl.² .......................................... H03B 3/04
[52] U.S. Cl. .................................. 331/1 A; 455/76; 455/87; 331/16; 331/25
[58] Field of Search .................. 331/1 A, 16, 18, 25; 325/17, 20, 25

[56] References Cited

U.S. PATENT DOCUMENTS

| | | | |
|---|---|---|---|
| 3,401,353 | 9/1968 | Hughes | 331/18 X |
| 3,921,095 | 11/1975 | Chu | 331/1 A |
| 4,061,973 | 12/1977 | Reimers et al. | 325/17 |

*Primary Examiner*—Siegfried H. Grimm
*Attorney, Agent, or Firm*—Stevens, Davis, Miller & Mosher

[57] ABSTRACT

A PLL synthesizer for a multi-channel civil band transceiver uses a D-flip-flop between a voltage controlled oscillator and a programmable divider which are parts of the loop. A reference signal is divided in a first divider to form a signal representing the frequency difference between adjacent transceiver channels which is applied to a phase comparator in the loop and the reference signal is frequency divided in a second divider to obtain a signal applied to the clock input of the D-flip-flop.

3 Claims, 5 Drawing Figures

PLL SYNTHESIZER

The present invention relates to a PLL (phase locked loop) synthesizer suitable for use in a civil band transceiver.

FIG. 1 shows a configuration of a most commonly used prior art PLL synthesizer for a 40-channel transceiver having transmission-reception frequencies between 26.965 MHz to 27.405 MHz.

Figure 1:
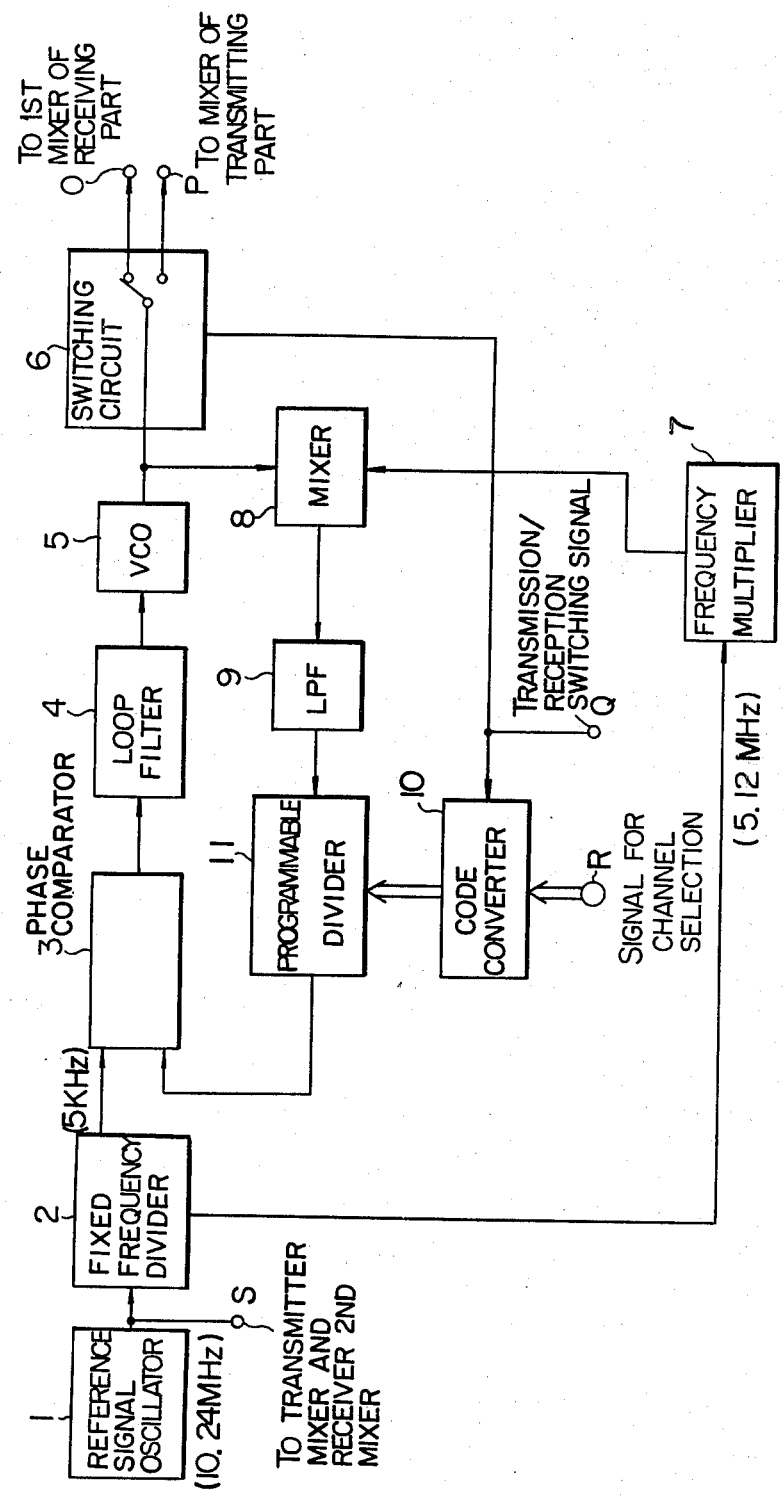
FIG. 1 shows a block diagram of a prior art PLL synthesizer.

In FIG. 1, numeral 1 denotes a reference signal oscillator including a 10.24 MHz crystal resonator, numeral 2 denotes a fixed frequency divider which frequency-divides the output signal from the reference signal oscillator 1 by a factor of two and applies the ½ frequency-divided output (of frequency of 5.12 MHz) to a frequency multiplier 7 which will be described later, and further frequency-divides the ½ frequency divided output by a factor of 1024 (total frequency division factor being 2048) and applies the 1/1024 frequency divided output (of the frequency of 5 KHz) to one input terminal of a phase comparator 3, which compares the phase of the output of the fixed frequency divider 2 with a phase of an output of a variable frequency divider 11 which will be described later, numeral 4 denotes a loop filter which converts the output of the phase comparator 3 to a control voltage for a voltage controlled oscillator (VCO) 5, an output frequency $f_{VCO}$ of which is controlled by the output of the loop filter 4, numeral 6 denotes a switching circuit which is actuated by a switching signal applied to a terminal Q to supply the output signal of the VCO 5 to a receiver first mixer through a terminal 0 during the reception and supply the output signal to a transmitter mixer through a terminal P during the transmission, numeral 7 denotes the frequency multiplier which frequency-multiplies the first output of the fixed frequency divider 2, that is, the ½ frequency divided signal (of the frequency of 5.12 MHz) of the output of the reference signal oscillator 1, by a factor of three (to make the signal of the frequency of 15.36 MHz), numeral 8 denotes a mixer which mixes the output signal of the VCO 5 with the output of the frequency multiplier 7, numeral 9 denotes a low pass filter which extracts and amplifies low frequency components ($f_{VCO}$- 15.36 MHz) of the output of the mixer 8, numeral 10 denotes a code converter which controls a frequency division factor of the variable frequency divider 11 in accordance with a channel selection signal from a terminal R and the transmission/reception switching signal from the terminal Q, numeral 11 denotes the programmable divider the frequency division factor of which is determined by the output signal of the code converter 10 and which applies the frequency divided output to the other input terminal of the phase comparator 3, and S denotes a terminal from which a signal is applied to the transmitter mixer and a receiver second mixer.

The receiving part of the transceiver is of double superheterodyne type with a first intermediate frequency of 10.695 MHz and a second intermediate frequency of 455 KHz. By selecting the first and second intermediate frequencies as stated above, it becomes possible to use the output of the reference signal oscillator 1 as a second local signal to produce the second intermediate frequency signal by mixing the second local signal with the first intermediate frequency signal.

The frequency range of the output signal of the VCO 5 required to produce the first intermediate frequency signal by mixing the output signal of the VCO 5 with the receiving signal is from 16.270 MHz (channel 1) to 16.710 MHz (channel 40), and the frequency division factor of the programmable divider 11 ranges from channel 1: $\frac{(16270 - 15360) \text{KHz}}{5 \text{KHz}} = 182$ to channel 40: $\frac{(16710 - 15360) \text{KHz}}{5 \text{KHz}} = 270$ In the transmitting part, a system is taken in which the output of the reference signal oscillator 1 is mixed with the output of the VCO 5 to produce the transmission frequencies ranging from 26.965 MHz (channel 1) to 27.405 MHz (channel 40). Thus, the output frequency of the VCO 5 during the transmission ranges from 16.725 MHz (channel 1) to 17.165 MHz (channel 40), and the frequency division factor of the programmable divider 11 ranges from channel 1: $\frac{(16725 - 15360) \text{KHz}}{5 \text{KHz}} = 273$ to channel 40: $\frac{(17165 - 15360) \text{KHz}}{5 \text{KHz}} = 361$ As described above, a feature of the above configuration resides in that only one crystal resonator for the reference signal oscillator is needed for the transceiver including the PLL, transmitting part and receiving part.

The above configuration, however, includes the following problems.

Firstly, when the output frequency of the VCO 5 during the transmission is selected as described above, the input frequency to the phase comparator 3 must be set to 5 KHz although minimum difference of frequency between channels at the transmission frequency is 10 KHz. Therefore, the frequency division factor of the programmable divider 11 is high and hence the stability of the PLL is likely to become deteriorated. Secondly, sprious noise is likely to occur during the transmission because the transmission signal is produced by mixing the output signal of the VCO 5 with the output of the reference signal oscillator 1.

The second problem described above may be resolved by making the output frequency of the VCO 5 during the transmission to be equal to the transmission frequency. A concrete configuration thereof is exemplified in FIG. 2.

Figure 2:
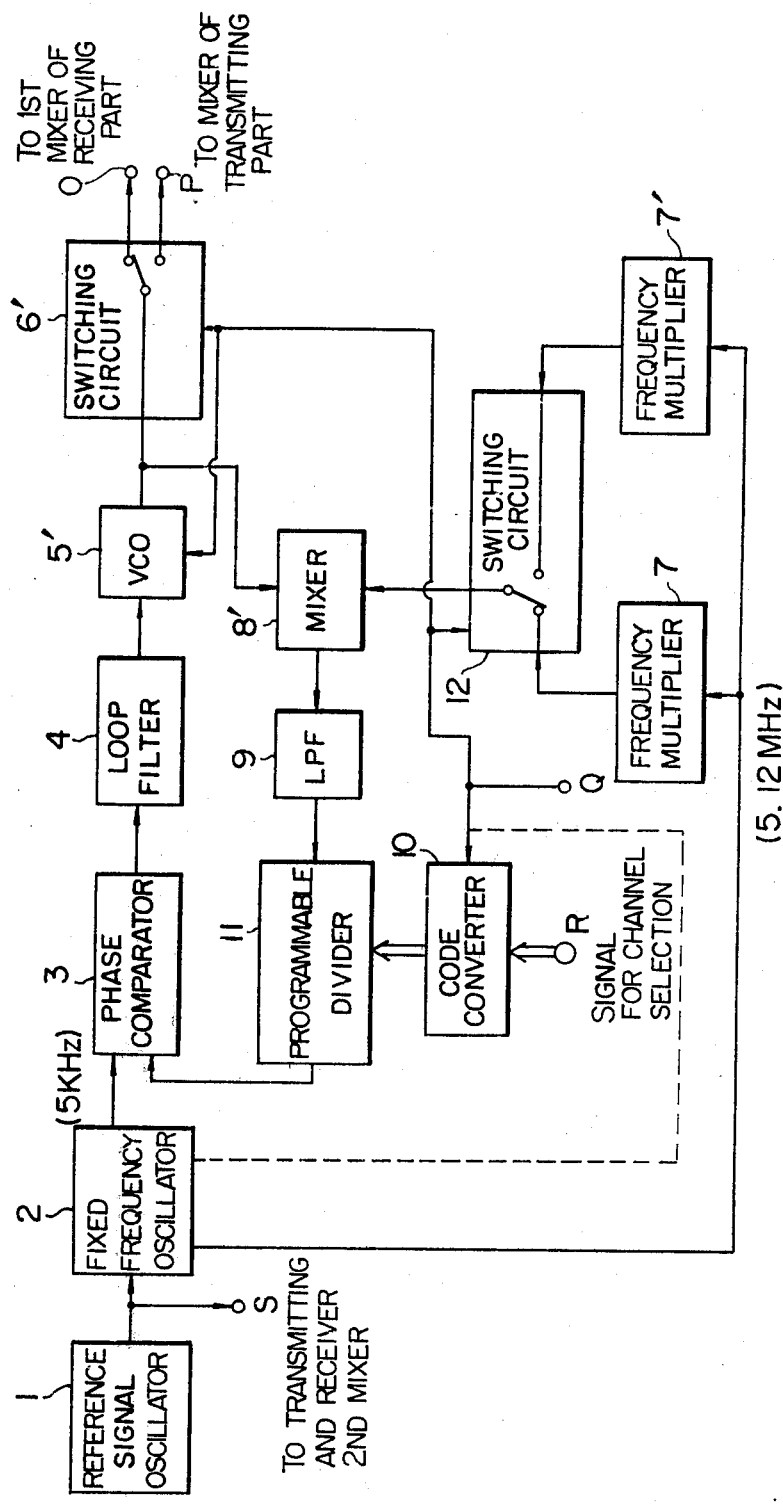
FIGS. 2, 3 and 5 show block diagrams of modifications of the PLL synthesizer shown in FIG. 1.

In FIG. 2, numerals 1 to 4 and 9 to 11 denote the same components as those in FIG. 1 and therefore the description thereof will be omitted here. Numeral 5' denotes a VCO of which the resonance circuit constant is switched by the transmission/reception switching signal so that an output frequency band is determined, and an output frequency of which is controlled by the output of the loop filter 4. As in the configuration of FIG. 1, the output frequency during the reception ranges from 16.270 MHz to 16.710 MHz, while the output frequency during the transmission ranges from 26.965 MHz to 27.405 MHz, which is the same as the range of the transmission-reception frequency. Numeral 6' denotes a switching circuit which is switched by the transmission/reception switching signal which supplies during the reception the output signal of the VCO 5' to the first mixer of the receiving part, and supplies during the transmission the output signal of the VCO 5' to an amplifier which amplifies the transmitting signal, numeral 7' denotes a frequency multiplier which frequency-multiplies the 5.12 MHz signal in the output of the fixed frequency divider 2 by a factor of five, numeral 12 denotes a switching circuit which is actuated by the transmission/reception switching signal to supply the output of the frequency multiplier 7 to a mixer 8' to be described later during reception and to supply the output of the frequency multiplier 7' to the mixer 8' during the transmission, numeral 8' denotes the mixer which mixes the output signal of the VCO 5' with the output signal from the switching circuit 12, and S denotes a terminal from which a signal is applied to the second mixer in the receiving part. The frequency division factor of the programmable divider 11 during the reception is the same as that in the configuration of FIG. 1, and the frequency division factor during the transmission is also made to be the same as shown below:

$$\text{channel 1:} \frac{(26965 - 25600)\text{KHz}}{5\text{KHz}} = 273$$

$$\text{channel 40:} \frac{(27405 - 25600)\text{KHz}}{5\text{KHz}} = 361$$

According to the configuration of FIG. 2, the output frequency of VCO 5' during the transmission can be made equal to the transmission-reception frequency without increasing the crystal resonator.

The configuration of FIG. 2, however, requires two frequency multipliers 7 and 7'. Furthermore, the input to the mixer 8' must be switched by the switching circuit 12 depending on the transmission and the reception and the low pass filter 9 must be inserted after the mixer 8'. Thus, the configuration of the circuit becomes complex in its construction. It is advantageous to use a digital mixer as shown in FIG. 3 as a circuit construction in place of the circuitry including the frequency multipliers 7 and 7', the switching circuit 12, the mixer 8' and the low pass filter 9.

Figure 3:
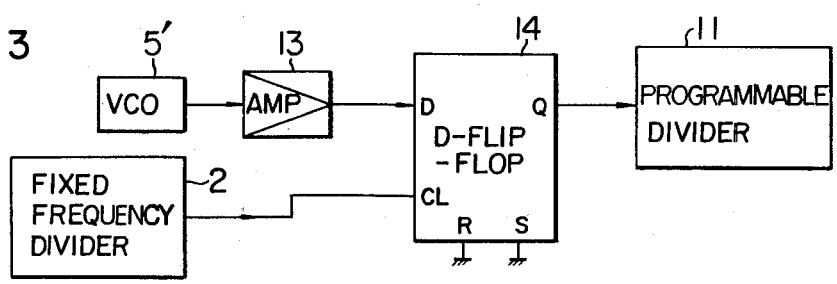

In FIG. 3, when an output of the VCO 5' is applied to a terminal D of a D-flip-flop 14, after being amplified by an amplifier 13, and the 5.12 MHz component in the output of the fixed frequency divider 2 is applied to a clock terminal CL of the D-flip-flop 14, the output frequency at a terminal Q (or $\overline{Q}$) of the D-flip-flop 14 becomes as follows:

$$f_i = |f_{VCO} - N \times 5.12 \text{ MHz}| \leq \frac{5.12}{2} \text{ MHz}$$
$$= 2.56 \text{ MHz}$$

where $f_i$ represents the output frequency of the D-flip-flop 14 and $f_{VCO}$ represents the output frequency of the VCO 5'.

That is, the digital mixing is to sample and hold the input signal applied to the terminal D of the D-flip-flop 14 with the input signal applied to the clock terminal CL of the D-flip-flop 14.

It is apparent from the above equation that the digital mixer has the frequency multiplying function, frequency multiplication factor switching function, mixing function and low-pass filter function. Accordingly, the construction becomes simplified.

The above configurations are approaches for solving one of the two problems described above, that is, a concrete system for making the output frequency of the VCO 5' during the transmission equal to the transmission frequency. However, the other problem, that is, the problem concerning the input frequency to the phase comparator 3 remains unresolved.

Figure 5:
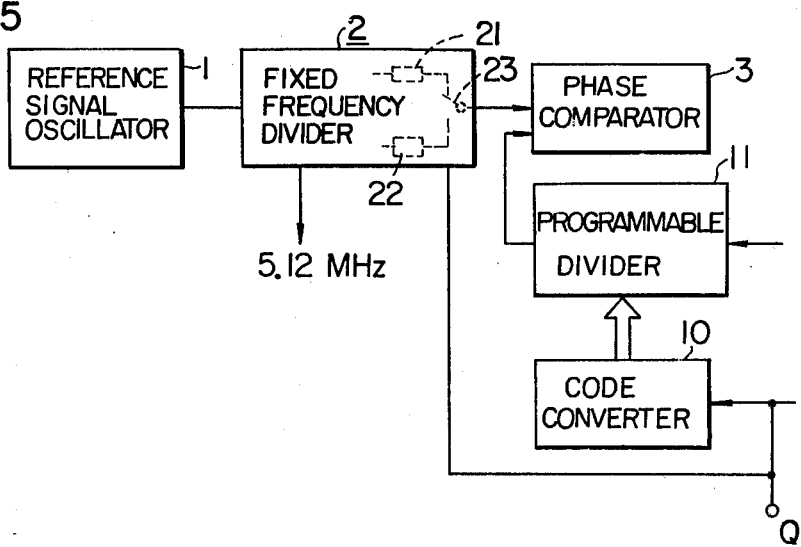

A countermeasure for the latter problem will now be explained. That is, as a countermeasure one may take the input frequency to the phase comparator 3 10 kHz during reception while keeping the input frequency during the transmission at 5 KHz. This is made possible by providing a 5 KHz frequency divider 21 and a 10 KHz frequency divider 22 in the fixed frequency divider 2 as shown in FIG. 5 and switching the input signal take out portion for the phase comparator 3 by a switch 23 so that the frequency division factor of the fixed frequency divider may become the 2048 during the transmission as stated above and 1024 only during reception. With this construction, the frequency division factor during reception is reduced to be one half and this makes it easier to stabilize the operation of the PLL.

Figure 4:
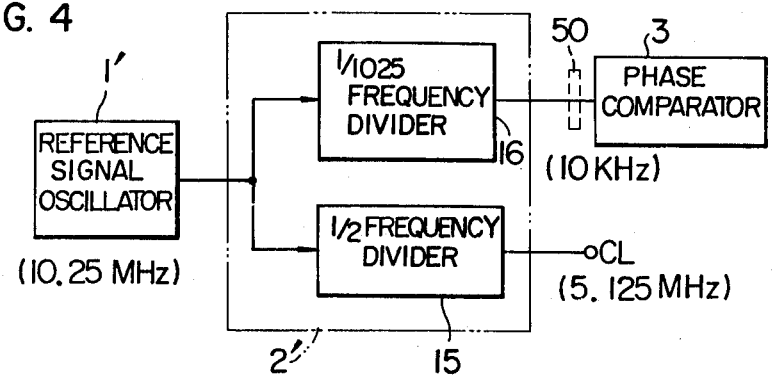
FIG. 4 shows a block diagram of a portion of a PLL synthesizer in accordance with one embodiment of the present invention.

FIG. 4 shows a block diagram of a PLL synthesizer in accordance with one embodiment of the present invention, in which, taking the above two problems into consideration, the output frequency of the reference frequency oscillator is set to be $(2n+1) \times f_r$ (where $f_r$ is a minimum frequency width between adjacent channels and n is a positive integer), and the fixed frequency divider 2 is constructed as shown in FIG. 4.

In FIG. 4, numeral 1' denotes a reference signal generator having an output frequency of 10.25 MHz, for example. Numeral 2' denotes a fixed frequency divider which corresponds to the fixed frequency divider 2 shown in FIG. 2 and comprises a ½ frequency divider 15 and a 1/1025 frequency divider 16. Thus, the ½ frequency divider 15 produces an output frequency of 5.125 MHz which is applied to the clock terminal CL of the D-flip-flop 14 while the 1/1025 frequency divider 16 produces an output frequency of 10 KHz which is supplied to the phase comparator 3. (In this case, a pulse width of the input signal to the phase comparator 3 becomes to be equal to $(1/2 \times 1.0250 \times 10^7)$ second. If this is too narrow for the pulse width of the input signal to the phase comparator 3, a circuit for extending the pulse width (e.g. a monostable multivibrator) 50 may be inserted at the output of the frequency divider 16.

By constructing the circuit as shown above, the output frequency of the digital mixer, that is, the input frequency to the programmable divider becomes:

$$f_1 = |f_{VCO} - N \times 5.125 \text{ MHz}| \leq 2.5625 \text{ MHz}$$

In the above equation, when the $f_{VCO}$ during the reception is in the 16 MHz band, N becomes equal to three. Thus, if the first intermediate frequency of the receiver is set to be 10.7 MHz, the second intermediate frequency of the receiver is set to 450 KHz and the frequency division factor of the programmable divider 11 is set between 89 (channel 1) to 133 (channel 40), then the output frequency of the programmable divider 11 when the PLL is locked, that is, the input frequency to the phase comparator 3 becomes equal to be 10 KHz, and the $f_{VCO}$ ranges from 16.265 MHz to 16.705 MHz. When transmitting N becomes equal to five. Thus, by setting the frequency division factor of the programmable divider 11 to be between 134 and 178, the input frequency to the phase comparator 3 becomes equal to 10 KHz and the $f_{VCO}$ ranges from 26.965 MHz to 27.405 MHz. (In FIGS. 2 to 5 description is made with reference to block figures, but the components of each block figure may each be known circuits.).

As described hereinabove, according to the present invention, by making the output frequency of the VCO 5' during the transmission coincide with the transmission frequency in using only one crystal resonator for the entire transceiver, and by setting the input frequency to the phase comparator to be 10 KHz it becomes possible to reduce the frequency division factor of the programmable divider 11 and to obtain a stable operation of the PLL. While a single crystal resonator is used in the transceiver in the above explanation, it should be understood that by using an output of a separate oscillation circuit as a local signal for the receiver second mixer instead of the output of the reference signal oscillator 1 freedom of design of the transceiver increases.

Furthermore, according to the present invention, since the stability of the PLL is improved and a spurious noise does not occur during the transmission, the transmission characteristics are improved. Accordingly, the present invention presents a remarkable effect particularly when it is used in a transceiver.

What is claimed is:

1. A phase lock loop frequency synthesizer for supplying oscillator signals to a multi-channel transceiver having transmission and reception modes comprising:

means for providing a reference frequency $f_{ref}=(2n+1)\times f_r$, where $f_r$ equals the frequency difference between adjacent channels of said transceiver and n is a positive integer;

a first frequency divider for dividing said reference frequency by $(2n+1)$ to produce a frequency $f_r$;

a second frequency divider for dividing said reference frequency to produce a clock signal;

a phase comparator having a first input connected to receive the output of said first frequency divider;

a loop filter connected to receive the output of said phase comparator;

a voltage controlled oscillator connected to receive the output of said loop filter and for generating frequencies in a first frequency range when said tranceiver is in the receiving mode and in a second frequency range when said transceiver is in the transmitting mode;

a D-flip-flop connected to receive at one of its input terminals the output of said voltage controlled oscillator and at a clock input terminal the output of said second frequency divider;

a programmable frequency divider connected to receive the output of said flip-flop and capable of producing frequency dividing factors in a first frequency dividing factor range when said frequency synthesizer supplies oscillator signals to said transceiver in a receiver mode and in a second frequency dividing factor range when said frequency synthesizer supplies oscillator signals to said transceiver in a transmitting mode, said programmable divider having an output connected to another input of said phase comparator;

means for selecting a frequency divider factor for said programmable divider in accordance with a selected transceiver channel; and, means for concurrently causing said voltage controlled oscillator to operate in one of said first and second frequency ranges and said programmable divider to operate in one of said first and second frequency dividing factor ranges in accordance with the transmitting or receiving mode of said transceiver.

2. A phase lock loop frequency synthesizer as in claim 1, wherein said multi-channel transceiver has 40 communicating channels, said reference frequency is 10.25 MHz, said first divider divides said reference frequency by a factor of 1025 to produce a 10 KHz signal to said phase comparator, said second divider divides by a factor of 2, said first voltage controlled oscillator frequency range is 26.965 to 27.405 MHz, said second voltage controlled oscillator frequency range is 16.265 to 16.705 MHz, said first frequency dividing factor range is 89 to 133 and said second frequency dividing factor range is 134 to 178.

3. A phase lock loop frequency synthesizer as in claims 1 or 2, further comprising a pulse width adjusting means connected between the output of said first frequency divider and the input of said phase comparator receiving the output of said first frequency divider.

* * * * *